Oct. 1, 1968 H. S. BEST ET AL 3,403,438

PROCESS FOR JOINING TRANSISTOR CHIP TO PRINTED CIRCUIT

Filed Dec. 2, 1964

INVENTORS.
Howard S. Best
Robert E. Bowser
BY Walter S. Zebrowski
ATTORNEY 3,403,438
Patented Oct. 1, 1968

3,403,438

PROCESS FOR JOINING TRANSISTOR CHIP TO PRINTED CIRCUIT

Howard S. Best and Robert E. Bowser, Raleigh, N.C., assignors to Corning Glass Works, Corning, N.Y., a corporation of New York Filed Dec. 2, 1964, Ser. No. 415,314
4 Claims. (Cl. 29—577)

This invention relates to semiconductor devices and more particularly to the attachment of transistors to printed circuits, but is in no way limited thereto.

This invention applies to semiconductor devices generally but for the purposes of simplicity it will be described in connection with transistors. Transistors have contacts or contact areas for the collector, emitter, and base. Heretofore, wires were connected between these transistor contacts and external leads embodied within the enclosure in which the transistor was mounted by means of thermocompression bonding or the like. Such wires had to be individually connected which was very time consuming and consequently very costly. Since the connections are very small it was difficult to make acceptable connections consistently. Furthermore, although the wires were connected at both ends, they were nevertheless free floating in between the ends often resulting in unsound mechanical connections. The free floating portion of these wires was able to move which often caused undue stress to be placed on the rigid welds at the ends thereof and particularly the ends bonded to the transistor contacts. In addition, the bonding itself frequently weakened the wires while the connections were being made.

After the transistor was enclosed, it would be connected to a circuit by means of said external leads which required additional connections that could also fail, as well as additional time and expense. Furthermore, such transistor attachment required much space.

It is an object of the present invention to overcome the hereinabove difficulties and to provide a simple, inexpensive method for attaching transistor chips to printed circuits which is rapid, reproducible, compact, and eliminates failure of mechanical connections between the transistor chip and the circuit.

Broadly, according to the present invention a flat substrate having a printed circuit formed on one of its surfaces and a planar-type transistor chip are provided each having a set of contact areas corresponding in number and position to each other. The transistor chip is disposed adjacent the printed circuit with the sets of contact areas in opposing register and a pillar of conductive material is placed between each pair of opposing contact areas. A force and vibratory energy is applied to the unit so formed to compact the pillars and weld each of the contact areas to its contacting pillar whereby each of the pillars forms a bond between a pair of contact areas.

Additional objects, features, and advantages of the present invention will become apparent to those skilled in the art, from the following detailed description and the attached drawing on which, by way of example, only the preferred embodiment of the invention is illustrated.

Figures 1, 2, 3:
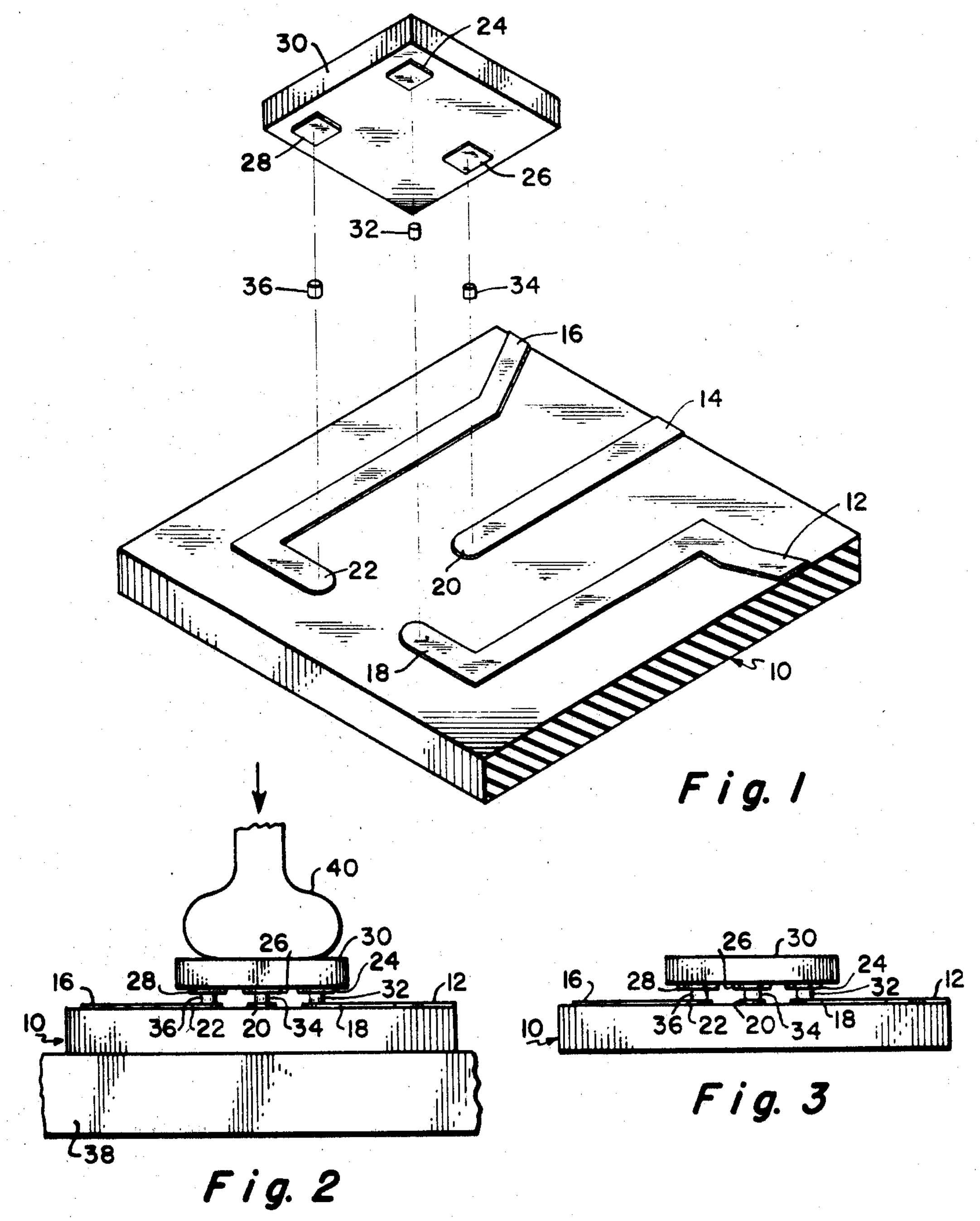
FIGURE 1 is an exploded oblique fragmentary view of the article of this invention.
FIGURE 2 is a side elevation illustrating a transistor chip being bonded to a printed circuit.
FIGURE 3 is a side elevation of the article formed by the method of this invention.

Referring to FIGURE 1, dielectric substrate 10 of glass, ceramic, glass-ceramic, plastic, or like material is provided with a printed circuit, illustrated by metallic conductive members 12, 14, and 16 formed on at least one surface thereof. The ends of members 12, 14, and 16 terminate in terminals, contacts, or contact areas 18, 20, and 22 respectively. A printed circuit may be formed by any of several methods well known by one familiar with the art.

Contact areas 18, 20, and 22 are the ends of said conductive members which are arranged in a predetermined desired order to correspond to similar metallic contact areas 24, 26, and 28 formed on transistor chip 30. Contact areas 24, 26 and 28 make electrical contact with the emitter, collector, and base electrodes of chip 30 and are formed by selective vapor deposition, metallizing, or the like methods well known to one familiar with the art.

Transistor chip 30 is disposed with its contact areas in opposing alignment or register with those on substrate 10. Contact area 18 is adjacent contact area 24, contact area 20 is adjacent contact area 26, and so on. Metallic pillars 32, 34, and 36 are provided and disposed between the sets of contact areas and in contact therewith. Suitable pillar materials are aluminum, copper, or the like. Pillar 32 is placed between contact areas 18 and 24, pillar 34 is placed between contact areas 20 and 26 and so on.

Referring now to FIGURE 2, the assembly so formed is placed on anvil 38 and vibratory member 40 is brought into contact with chip 30. A force is applied to the assembly and vibratory energy is introduced thereto by means of member 40 to weld each opposing pair of contact plates to the respective contacting pillar and to compress the pillars. Said pillars are welded to said contact areas and form a metallurgical bond and electrical connection therebetween. FIGURE 3 illustrates the completed article of this invention.

It has been found that an article produced by the method of this invention is simple, inexpensive and eliminates failures of mechanical connections between the transistor chip and the circuit. In addition, the method may be performed rapidly and reproducibly, and results in a compact article.

Although the present invention has been described with respect to specific details of certain embodiments thereof, it is not intended that such details be limitations upon the scope of the invention except insofar as set forth in the following claims.

We claim:

1. The process of bonding a planar-type transistor chip to a printed circuit comprising the steps of providing a flat substrate having a printed circuit formed on one surface thereof, said printed circuit having a first plurality of contact areas embodied therein in a predetermined desired arrangement, providing a planar-type transistor chip having a second plurality of contact areas on one surface thereof corresponding in number to said first contact areas and having an opposing arrangement thereto, disposing said chip adjacent said printed circuit with said first contact areas in register with said second contact areas, disposing a solid conductive pillar intermediate each pair of opposing contact areas, applying a force to the unit so formed, introducing vibratory energy to said unit and compacting said pillars to simultaneously weld corresponding first and second contact areas to said pillars whereby said pillars form a bond therebetween.

2. The process of claim 1 wherein said substrate is formed of material selected from the group consisting of glass, ceramic, glass-ceramic and plastic.

3. The process of claim 1 wherein said conductive pillars are formed of aluminum.

4. The process of bonding a transistor chip to a printed circuit comprising the steps of providing a flat substrate having a printed circuit formed on one surface thereof, said printed circuit having at least one contact area embodied therein in a predetermined desired position, providing a transistor chip having at least one contact area on one surface thereof corresponding in number to said contact areas embodied within said printed circuit and having an opposing arrangement thereto, disposing said chip adjacent said printed circuit with the contact areas on said chip in register with said contact areas within said printed circuit, disposing a solid conductive pillar intermediate each pair of opposing contact areas, applying a force to the unit so formed, introducing vibratory energy to said unit and compacting said pillars to simultaneously weld corresponding printed circuit and transistor contact areas to said pillars whereby said pillars form a bond therebetween.

References Cited

UNITED STATES PATENTS

| | | | |
|---|---|---|---|
| 3,235,945 | 2/1966 | Hall | 29—492 X |
| 3,255,511 | 6/1966 | Weissenstern | 29—472.9 X |
| 3,271,625 | 9/1966 | Caracciolo | 174 |
| 3,330,026 | 7/1967 | Best | 29—488 X |
| 3,341,649 | 9/1967 | James | 174 |
| 3,071,216 | 1/1963 | Jones et al. | 29—471.1 |
| 3,184,831 | 5/1965 | Siebertz | 29—471.1 |

JOHN F. CAMPBELL, *Primary Examiner.*

R. F. DROPKIN, *Assistant Examiner.*